United States Patent
Kise et al.

(10) Patent No.: US 7,525,726 B2
(45) Date of Patent: Apr. 28, 2009

(54) PHOTONIC CRYSTAL SEMICONDUCTOR DEVICE AND PRODUCTION METHOD THEREOF

(75) Inventors: Tomofumi Kise, Tokyo (JP); Tatsuya Kimoto, Tokyo (JP); Noriyuki Yokouchi, Tokyo (JP); Toshihiko Baba, Tokyo (JP)

(73) Assignees: The Furukawa Electric Co., Ltd., Tokyo (JP); Toshihiko BABA, Tokyo (JP)

( * ) Notice: Subject to any disclaimer, the term of this patent is extended or adjusted under 35 U.S.C. 154(b) by 0 days.

(21) Appl. No.: 11/505,428

(22) Filed: Aug. 17, 2006

(65) Prior Publication Data

US 2007/0013991 A1    Jan. 18, 2007

Related U.S. Application Data

(63) Continuation of application No. PCT/JP2005/002342, filed on Feb. 16, 2005.

(30) Foreign Application Priority Data

Feb. 17, 2004    (JP) ............................... 2004-040122

(51) Int. Cl.
*H01S 5/00* (2006.01)
(52) U.S. Cl. .................... 359/344; 385/131; 438/31; 438/32
(58) Field of Classification Search .............. 359/344; 385/131; 438/31, 32
See application file for complete search history.

(56) References Cited

U.S. PATENT DOCUMENTS

| 5,684,817 | A | 11/1997 | Houdre et al. |
| 6,134,043 | A | 10/2000 | Johnson et al. |
| 6,468,823 | B1 * | 10/2002 | Scherer et al. ................ 438/31 |

(Continued)

FOREIGN PATENT DOCUMENTS

GB    2 366 666 A    3/2002

(Continued)

OTHER PUBLICATIONS

Zhou et al. "Electrically injected single-defect photonic bandgap surface-emitting laser at room temperature", Electronics Letters, vol. 36, No. 18, pp. 1541-2542 (Aug. 31, 2000).*

(Continued)

*Primary Examiner*—Eric Bolda
(74) *Attorney, Agent, or Firm*—Oblon, Spivak, McClelland, Maier & Neustadt, P.C.

(57) ABSTRACT

To provide a photonic crystal semiconductor device which enables various kinds of optical devices having a photonic crystal structure which is readily formed using a semiconductor and a semiconductor manufacturing process, and a manufacturing method thereof. The object can be achieved by a photonic crystal structure, including a lower DBR layer 1, a core layer 2, an upper DBR layer 3, and a dielectric multilayer film 6 which are sequentially laminated from an n-InP substrate 11 side, a plurality of holes 9 formed in the direction of a film thickness in the core layer 2 and the upper DBR layer 3, and a line defect portion 10 with none of the plurality of holes formed therein and disposed between the plurality of holes 9, wherein the line defect portion 10 serves as an optical waveguide.

21 Claims, 14 Drawing Sheets

U.S. PATENT DOCUMENTS

| | | | |
|---|---|---|---|
| 6,472,691 B2 * | 10/2002 | Mukaihara et al. | 257/115 |
| 6,499,888 B1 * | 12/2002 | Wu | 385/88 |
| 6,560,006 B2 * | 5/2003 | Sigalas et al. | 359/321 |
| 6,574,383 B1 * | 6/2003 | Erchak et al. | 385/15 |
| 6,674,949 B2 * | 1/2004 | Allan et al. | 385/129 |
| 6,683,898 B2 * | 1/2004 | Østergaard et al. | 372/43.01 |
| 6,829,281 B2 * | 12/2004 | Deng et al. | 372/96 |
| 6,943,377 B2 * | 9/2005 | Gaska et al. | 257/79 |
| 7,136,561 B2 * | 11/2006 | Enokido | 385/129 |
| 2002/0126721 A1 | 9/2002 | Masahiro et al. | |
| 2002/0146196 A1 | 10/2002 | Shirane et al. | |
| 2002/0159126 A1 | 10/2002 | Mihail et al. | |
| 2003/0209716 A1 | 11/2003 | Masahiro et al. | |
| 2004/0099869 A1 * | 5/2004 | Gaska et al. | 257/79 |
| 2005/0173717 A1 * | 8/2005 | Lee et al. | 257/98 |

FOREIGN PATENT DOCUMENTS

| | | | |
|---|---|---|---|
| JP | 2001-257425 | | 9/2001 |
| JP | 2002-522810 A | | 7/2002 |
| JP | 2002-303836 A | | 10/2002 |
| JP | 2002-341164 A | | 11/2002 |
| JP | 2003-131028 A | | 5/2003 |
| JP | 2003-224322 | | 8/2003 |
| JP | 2004-37938 A | | 2/2004 |
| JP | 2005274927 A | * | 10/2005 |
| WO | WO 00/10040 A | | 2/2000 |

OTHER PUBLICATIONS

M. Ito, et al., "Enhancement of Cavity-Q in a Quasi-Three Dimensional Photonic Crystal", Extended Abstracts of the 2003 International Conference on Solid State Devices and Materials, Tokyo 2003, pp. 870-871.

Hideo Kosaka, et al., "Superprism phenomena in photonic crystals", The American Physical Society, Physical Review B, vol. 58, No. 16, Oct. 15, 1998, pp. R10 096-R10 099.

Toshihiko Baba, "Photonic Crystals and Micro/Nanolasers", JSPS Colloquium on Photonics, Jun. 2, 2003, THe IT-University, Kista, pp. 9-10.

Toshihiko Baba, et al., "Device Applications of Semiconductor Photonic Crystal", The 10th International Workshop on Femtosecond Technology, Jul. 16-17, 2003 Chiba, Japan, pp. 84-87.

F. Romstad, et al., "True photonic band-gap mode-control in VCSEL structures", ECOC' 03, XP009100328, Sep. 21-25, 2003, 2 Pages.

* cited by examiner

OXIDIZED PORTION

HOLE    39  30
            POINT DEFECT PORTION

PHOTONIC CRYSTAL SEMICONDUCTOR DEVICE AND PRODUCTION METHOD THEREOF

This application is a continuation application of, and claims priority to, PCT/JP2005/002342, filed on Feb. 16, 2005, and claims the benefit of priority from Japanese Patent Application No. 2004-040122, filed Feb. 17, 2004, the entire contents of each of which are incorporated herein by reference.

TECHNICAL FIELD

The present invention relates to a photonic crystal semiconductor device, such as an optical waveguide, a variable wavelength filter, an optical switch, an optical modulator, an optical resonator, and a semiconductor laser, utilizing a photonic crystal structure having a defect portion in a two-dimensional periodic structure of refractive index whose period is near a wavelength of light, and a manufacturing method thereof.

RELATED ART

In recent years, a photonic crystal attracts attention as a key technology for realizing a next-generation micro optical integrated circuit, and energetic researches for it have been conducted by many research institutions from both sides of theory and experiment. The photonic crystal is a crystal having a structure where a refractive index is modulated at a period near a wavelength of light. Since, in the photonic crystal, a photonic band gaps (PBG) to the light are formed in accordance with a solution of the Maxwell equation in a periodic field, light with a frequency corresponding to the PBG can not be propagated in any direction within the crystal. When a defect is introduced in such a photonic crystal by an appropriate design, the light with the frequency corresponding to the PBG can not reside within the photonic crystal except for in the defect, resulting in that the light is localized in the defect. As a result, that makes it possible to realize a light trapping (resonator) by means of a point defect or an optical waveguide by means of a line defect.

In a strict sense, PBG is realized only by a three-dimensional photonic crystal, whereas its manufacturing process is extremely complicated and difficult. Meanwhile, it is known that, even in a two-dimensional photonic crystal, a certain degree of effect may be obtained by the its manufacturing process is extremely complicated and difficult. Meanwhile, it is known that, even in a two-dimensional photonic crystal, a certain degree of effect may be obtained by the PBG. Generally, the manufacturing of the two-dimensional photonic crystal utilizes a total internal reflection confinement using a refractive index difference as an optical confinement in the vertical direction. A structure, where the photonic crystal is formed in a core layer of high refractive index of a waveguide layer and is disposed between cladding layers of low refractive index, is referred to as a two-dimensional photonic crystal slab structure, and may include a photonic crystal formed on an SOI (Silicon on Insulator) substrate, an air-bridge type disposed between air claddings, or the like.

Non-patent Document 1: M. Ito, et al., Extended Abstracts of the 2003 International Conference on Solid State Devices and Materials, Tokyo, 2003, pp. 870-871

However, since the air-bridge type is mechanically brittle and has an extremely high thermal resistance due to its structure, it may not be suitable for an active device such as a light-emitting element. For this reason, the active device such as the light-emitting element utilizing current injection requires to have the two-dimensional photonic crystal slab structure disposed between semiconductor cladding layers for disposing a control electrode thereon.

Meanwhile, the two-dimensional photonic crystal slab structure has had a problem of a leaky mode called a light cone wherein the light is emitted in upward and downward directions. The existence of the radiation mode is more prominent when the refractive index n of a material used for the cladding is high. Although the effect of the radiation mode might be avoided in the air-bridge type using the air cladding (n=1), it can not be avoided in a semiconductor cladding (n≈3). The problem will be crucial not only for realizing passive devices such as an ordinary waveguide but also for realizing active devices such as light emitting elements.

As one attempt to control the radiation leaky mode in the upward and downward directions, there is suggested that a quasi-three-dimensional photonic crystal point defect resonator structure, provided with a distributed Bragg reflector (DBR) constituted by an air layer and a semiconductor GaAs layer on both sides in vertically upside and downside and on both lateral sides of the core layer, is used in such a way that light emitted in the vertical direction is reflected and returned by the DBR to enhance an optical confinement (see Non-Patent Document 1). Disclosed in the document is a photonic crystal resonator disposed between the DBRs constituted by the air layer and the semiconductor layer, which theoretically demonstrates that, as compared to the ordinary two-dimensional photonic crystal slab structure, the resonator can have an increased Q value of the resonator while maintaining a small mode volume.

This photonic crystal resonator, however, has the DBR constituted by the air layer and the semiconductor layer, so that there is a problem that it can not be utilized as an electrically controllable device.

Moreover, when considering a device using the DBR constituted solely by semiconductor layers for the electrical control, the core layer needs to be disposed between the semiconductor DBRs constituted by 20 to 30 pairs in order to efficiently confine the light. In order to form the two-dimensional photonic crystal in this structure, the structure must be etched to form holes which pass through at least an upper DBR and a core portion (waveguide layer), or which further extends to a lower DBR. Considering herein that the hole diameter is several hundreds of nanometer, the hole with an aspect ratio of 20:1 or greater should be formed, posing a problem that the formation of the hole having such size and shape as designed is extremely difficult.

The present invention has been made based on the aforementioned view, and aims at providing a photonic crystal semiconductor device capable of readily forming various kinds of optical devices having the photonic crystal structure using the semiconductor and a semiconductor manufacturing process, and a manufacturing method thereof.

SUMMARY OF THE INVENTION

According to a first aspect of the present invention, there is provided a photonic crystal semiconductor device, including a semiconductor substrate, a lower semiconductor distributed Bragg reflector multilayer film laminated on the semiconductor substrate, a semiconductor core layer laminated on the lower semiconductor distributed Bragg reflector multilayer film, an upper semiconductor distributed Bragg reflector multilayer film laminated on the semiconductor core layer, and a dielectric multilayer film laminated on said upper semiconductor distributed Bragg reflector multilayer film, wherein a plurality of holes passing through the upper semiconductor distributed Bragg reflector multilayer film and the semiconductor core layer are provided to form a photonic crystal structure in the semiconductor core layer, said photonic crystal structure having a two-dimensional periodic structure of refractive index whose period is near a wavelength of light.

According to a second aspect of the present invention, in the first aspect, there is provided the photonic crystal semiconductor device, wherein the two-dimensional periodic structure of refractive index has a line defect portion with none of the plurality of holes formed therein, the line defect portion being disposed between the holes.

According to a third aspect of the present invention, in the first aspect, there is provide the photonic crystal semiconductor device, wherein the two-dimensional periodic structure of refractive index has a point defect portion with none of the plurality of holes formed therein, the point defect portion being disposed among the holes.

According to a fourth aspect of the present invention, in any one of the above first to third aspects, there is provided the photonic crystal semiconductor device, further including a lower cladding layer laminated between the lower semiconductor distributed Bragg reflector multilayer film and the semiconductor core layer, and an upper cladding layer laminated between the semiconductor core layer and the upper semiconductor distributed Bragg reflector multilayer film, wherein the plurality of holes pass through the upper cladding layer and the lower cladding layer.

According to a fifth aspect of the present invention, in any one of the above first to fourth aspects, there is provided the photonic crystal semiconductor device, wherein the plurality of holes passing through a part or all layers of the lower semiconductor distributed Bragg reflector multilayer film.

According to a sixth aspect of the present invention, in the above first aspect, there is provided the photonic crystal semiconductor device, wherein an electrode is provided to apply a current or a voltage to the photonic crystal structure portion.

According to a seventh aspect of the present invention, in any one of the above second to fifth aspects, there is provide the photonic crystal semiconductor device, wherein an electrode is provided to apply a current or a voltage to the photonic crystal structure portion.

According to an eighth aspect of the present invention, in any one of the above first to seventh aspects, there is provided the photonic crystal semiconductor device, wherein a selective oxidation layer containing Al for current constriction is disposed in a vicinity of the semiconductor core layer.

According to a ninth aspect of the present invention, in any one of the above second to eighth aspects, there is provided the photonic crystal semiconductor device, wherein the semiconductor core layer has an active layer.

According to a tenth aspect of the present invention, in any one of the above first to ninth aspects, there is provided the photonic crystal semiconductor device, wherein the semiconductor core layer has a multiple quantum well structure.

According to an eleventh aspect of the present invention, in any one of the above first to tenth aspects, there is provided the photonic crystal semiconductor device, wherein the semiconductor core layer includes InGaAsP.

According to a twelfth aspect of the present invention, in any one of the above first to tenth aspects, there is provided the photonic crystal semiconductor device, wherein the semiconductor core layer includes GaInNAsSb.

According to a thirteenth aspect of the present invention, in any one of the above first to tenth aspects, there is provided the photonic crystal semiconductor device, wherein the semiconductor core layer includes AlGaInAs.

According to a fourteenth aspect of the present invention, there is provided a variable wavelength filter, including the photonic crystal semiconductor device according to the above seventh to thirteenth aspects, and a variable power source connected to the electrode, wherein light propagating through the defect portion is filtered.

According to a fifteenth aspect of the present invention, there is provided an optical switch/modulator, including the photonic crystal semiconductor device according to the above seventh to thirteenth aspects, a power source connected to the electrode, a switch device for switching power supply from the power source to the photonic crystal semiconductor device, and a control device for controlling switching of the switch device, wherein the control device switches or modulates the light propagating through the defect portion.

According to a sixteenth aspect of the present invention, there is provided a variable wavelength laser, including a the photonic crystal semiconductor device according to the above seventh to thirteenth aspects, and a variable power source connected to the electrode, wherein a laser beam with a variable wavelength amplified in the defect portion is outputted.

According to a seventeenth aspect of the present invention, in the above first aspect, there is provided the photonic crystal semiconductor device, wherein a semiconductor laser element having an active layer optically connected with the semiconductor core layer is formed on the semiconductor substrate.

According to an eighteenth aspect of the present invention, in the above seventeenth aspect, there is provided the photonic crystal semiconductor device, wherein the two-dimensional periodic structure of refractive index has a line defect portion with none of the plurality of holes formed therein, the line defect portion being disposed between the holes, and the active layer is optically connected with the line defect portion of the semiconductor core layer.

According to a nineteenth aspect of the present invention, there is provided a manufacturing method of the photonic crystal semiconductor device which utilizes a photonic crystal structure provided with a defect portion in a two-dimensional periodic structure of refractive index whose period is near a wavelength of light, the method including a lamination process for sequentially laminating a lower semiconductor distributed Bragg reflector multilayer film, a semiconductor core layer in which the photonic crystal is to be formed, and an upper semiconductor distributed Bragg reflector multilayer film on a semiconductor substrate, a hole formation process for forming a plurality of holes passing through the upper semiconductor distributed Bragg reflector multilayer film and the semiconductor core layer, and a dielectric multilayer film formation process for forming a dielectric multilayer film on the upper semiconductor Bragg reflector multilayer film.

According to a twentieth aspect of the present invention, in the above nineteenth aspect, there is provided the manufacturing method of the photonic crystal semiconductor device, wherein the hole formation process includes forming a line defect portion or a point defect portion among the holes, the line defect portion or the point defect portion being formed with none of the plurality of holes therein.

According to a twenty-first aspect of the present invention, in the above nineteenth or twentieth aspect, there is provided the manufacturing method of the photonic crystal semiconductor device, wherein the hole formation process includes forming the plurality of holes passing through a part or all layers of the lower semiconductor distributed Bragg reflector multilayer film.

According to a twenty-second aspect of the present invention, in any one of the above nineteenth to twenty-first aspects, there is provided the manufacturing method of the photonic crystal semiconductor device, wherein the lamination process includes sequentially laminating a selective oxidation layer and a contact layer further on the upper semiconductor Bragg reflector multilayer film, and the hole formation process includes forming a hole passing through the selective oxidation layer and the contact layer as well and forming a oxidized portion for current constriction in a part of the selective oxidation layer.

According to a twenty-third aspect of the present invention, in any one of the above nineteenth to twenty-second aspects, there is provided the manufacturing method of the photonic crystal semiconductor device, further including an electrode formation process for forming an electrode on a part of an upper side of the contact layer and a lower side of the semiconductor substrate.

In the photonic crystal semiconductor device and the manufacturing method thereof according to the present invention, the lower semiconductor distributed Bragg reflector multilayer film, the semiconductor core layer in which the photonic crystal is to be formed, the upper semiconductor distributed Bragg reflector multilayer film and the dielectric multilayer film are sequentially laminated on the semiconductor substrate. The core layer is formed with the photonic crystal structure having a plurality of holes that pass through the upper semiconductor distributed Bragg reflector multilayer film and the semiconductor core layer. In such a structure, since the light can be reflected and confined vertically by the upper semiconductor distributed Bragg reflector multilayer film and the dielectric multilayer film, the optical confinement can be surely performed with a fewer number of pairs in the upper semiconductor distributed Bragg reflector multilayer film, and the aspect ratio (depth/diameter) of the hole formed in the semiconductor layer can be reduced. Consequently, it achieves an effect that the device not inferior to the air-bridge type photonic crystal device can be readily produced by means of the semiconductor process.

DETAILED DESCRIPTION OF THE INVENTION

Hereinafter, the best mode of a photonic crystal semiconductor device and a manufacturing method thereof, for carrying out the present invention, will be described.

First Embodiment

Firstly, a variable wavelength filter as a photonic crystal semiconductor device according to a first embodiment will be described.

Figure 1:
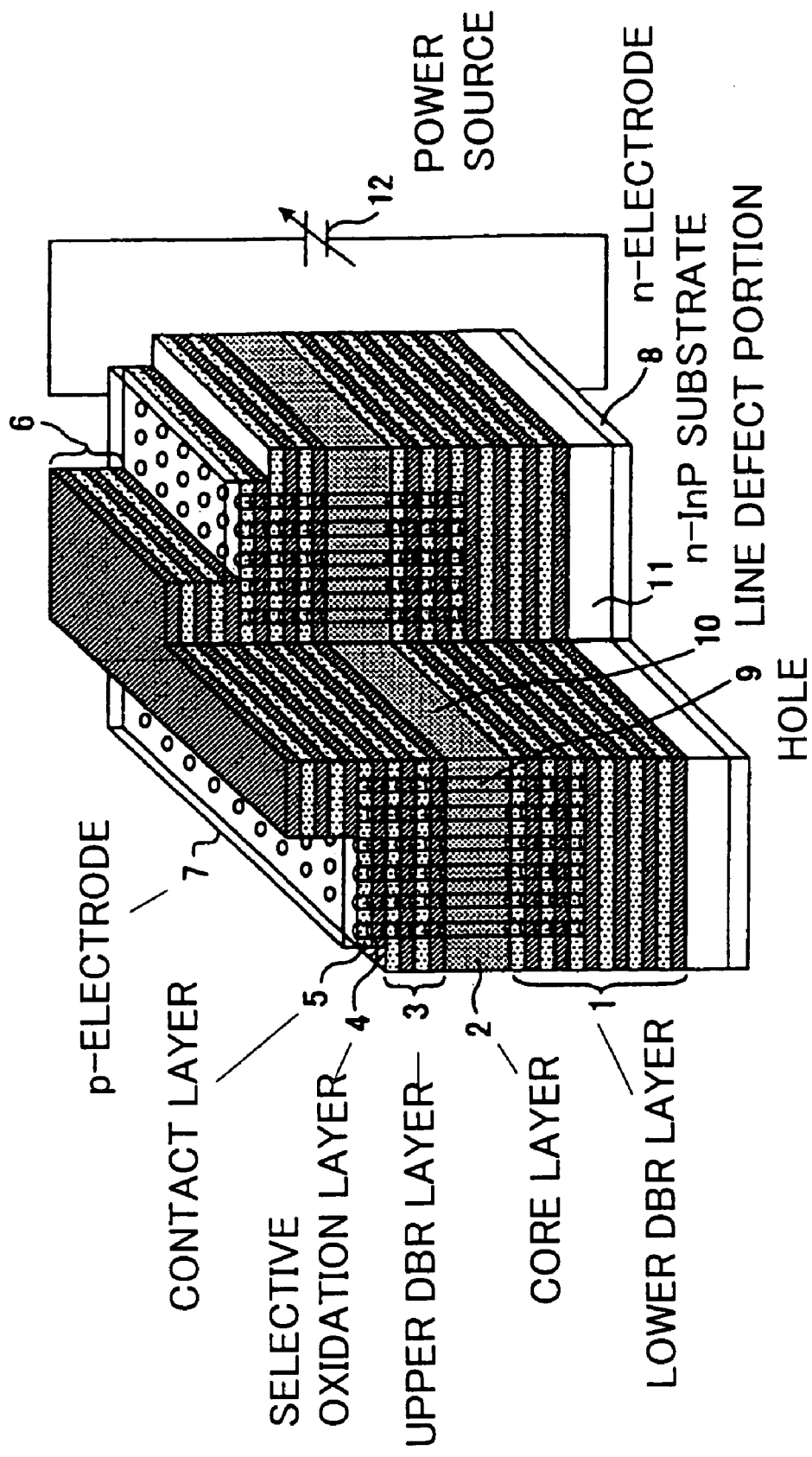
FIG. 1 is a partially cutaway view in perspective of a variable wavelength filter as a photonic crystal semiconductor device, according to a first embodiment of the present invention.
Figure 2:
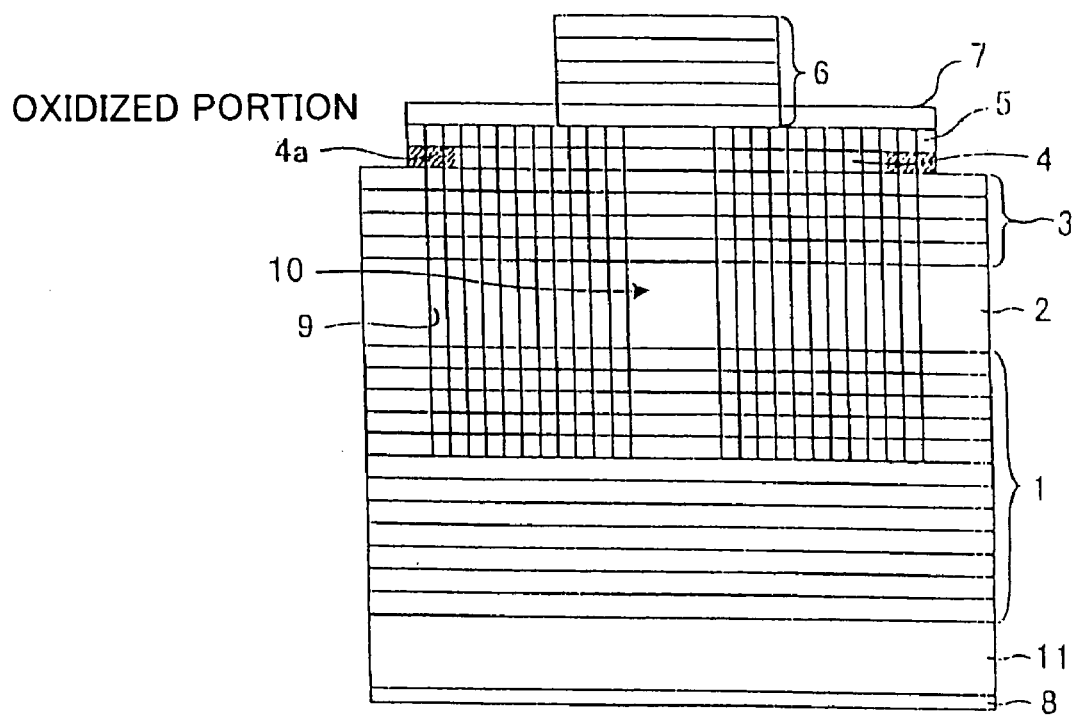
FIG. 2 is a cross-sectional view of the variable wavelength filter of FIG. 1.
Figure 3:
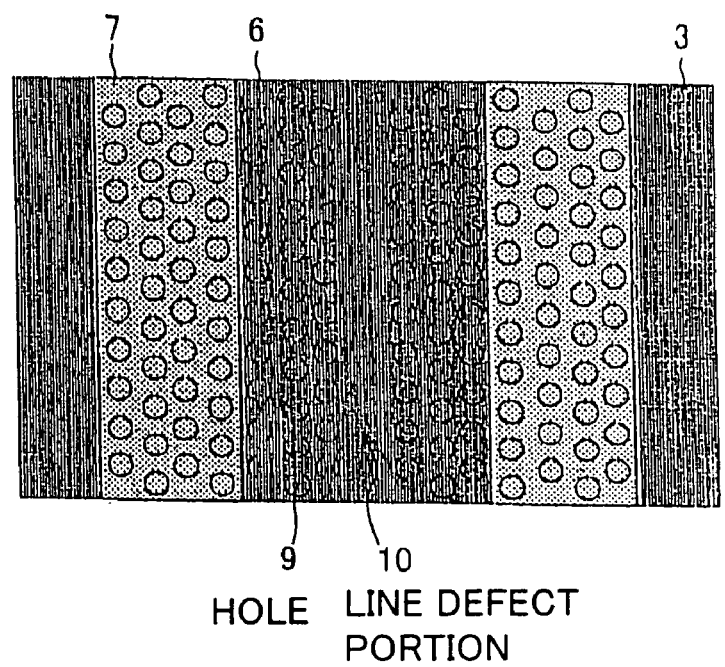
FIG. 3 is a plan view of the variable wavelength filter of FIG. 1.

FIG. 1 is a partially cutaway view in perspective of the variable wavelength filter according to the first embodiment of the present invention. FIG. 2 is a cross-sectional view of the variable wavelength filter of FIG. 1. FIG. 3 is a plan view of the variable wavelength filter of FIG. 1. In FIGS. 1 through 3, the variable wavelength filter utilizes a photonic crystal structure having a line defect portion 10, i.e., a line-shaped defect portion 10, which serves as an optical waveguide. The variable wavelength filter is capable of varying a passing wavelength band of the optical waveguide by changing a refractive index of the photonic crystal structure. The length of the optical waveguide is 10 µm to 100 µm. Incidentally, the passing wavelength band is a 1550 nm band.

The variable wavelength filter has a structure with an n-InP substrate 11 having a thickness of approximately 120 µm on which a lower DBR layer 1, a core layer 2, an upper DBR layer 3, a selective oxidation layer 4, a contact layer 5 are laminated in that order. A plurality of cylindrical holes 9 are formed in a triangular configuration which pass through a part of the lower DBR layer 1 on the core layer side, the core layer 2, the upper DBR layer 3, the selective oxidation layer 4, and a contact layer 5. The line defect portion 10, surrounded by the holes 9 and where the holes 9 do not exist in the linear portion, is formed. Additionally, a dielectric multilayer film 6 is formed on the contact layer 5 in a stripe-shaped region corresponding to the line defect portion 10, while a p-electrode 7 is formed on both sides of the dielectric multilayer film 6 on the contact layer 5 in a region where the dielectric multilayer film 6 is not formed. Moreover, under the n-InP substrate 11, an n-electrode 8 opposed to the p-electrode 7 is formed. Furthermore, a current-variable power source 12 is connected between the p-electrode 7 and the n-electrode 8.

The lower DBR layer 1 is a multilayered n-type semiconductor distributed Bragg reflector constituted by 30 pairs of InGaAsP/AlInAs. The core layer 2 has a composition where the wavelength of an energy bandgap is 1300 nm, formed by InGaAsP herein having a thickness of 597 nm. The upper DBR layer 3 is a multilayered p-type semiconductor distributed Bragg reflector constituted by two pairs of InGaAsP/AlInAs. On both ends of the selective oxidation layer 4, an oxidized portion 4a is formed by oxidation processing to thereby perform current constriction. The selective oxidation layer 4 is formed by a semiconductor containing aluminum, such as AlInAs. The contact layer 5 is formed by a p-type semiconductor.

The plurality of holes 9 each has a diameter of 200 nm and are arranged with a lattice constant of 350 nm. The line defect portion 10 has a width of 406 nm. The core layer 2 having the plurality of holes 9 and the line defect portion 10 forms a photonic crystal structure. It should be noted that the parameters of the photonic crystal structure may be determined by an intended wavelength of light. For example, the lattice constant of the holes 9 may be within a range of 300 to 400 nm.

The dielectric multilayer film 6 is a dielectric multilayer film constituted by three pairs of $SiO_2$ and amorphous silicon. Thicknesses of $SiO_2$ and the amorphous silicon are 340 nm and 149 nm, respectively. A reflectivity of the dielectric multilayer film 6 is 99.9% or greater.

The p-electrode 7 is realized by a multilayered structure of Ti/Pt/Au, while the n-electrode 8 is realized by a multilayered structure of AuGeNi/Au.

In the variable wavelength filter presented in the first embodiment, because of the photonic crystal structure, light leakage from the line defect portion 10 does not occur in the direction perpendicular to the lamination direction in the core layer 2, so that the light in the wavelength of 1550 nm-band is confined within the line defect portion 10. Meanwhile, in the lamination direction, the light in the wavelength of 1550 nm-band is confined by the lower DBR layer 1, the upper DBR layer 3, and the dielectric multilayer film 6. As a result, the line defect portion 10 serves as the optical waveguide of 1550 nm-band. In this case, when the amount of current injected by the power source 12 is changed, the refractive index of the photonic crystal structure portion changes and in turn changes the wavelength band in which the line defect portion 10 is able to guide light, resulting in that the device serves as the variable wavelength filter. (It should be noted that, when the p-electrode 7, the n-electrode 8, and the power source 12 are not disposed, the device serves as a slab waveguide which guides only a predetermined wavelength light.)

Next, a manufacturing method of the variable wavelength filter shown in FIG. 1 will be described with reference to FIGS. 4 through 7.

Figure 4:
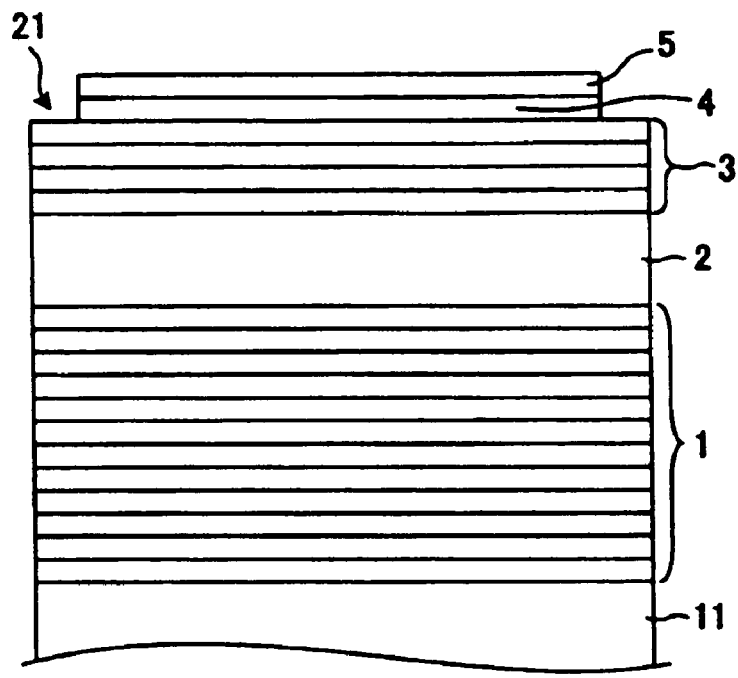
FIG. 4 is a first diagram illustrating a manufacturing process of the variable wavelength filter of FIG. 1.

Firstly, using an MOCVD (Metal-Organic Chemical Vapor Deposition) crystal growth apparatus, the lower DBR layer 1, the core layer 2, the upper DBR layer 3, the selective oxidation layer 4, and the contact layer 5 are sequentially formed on the n-InP semiconductor substrate. Then, using photolithography and dry-etching apparatuses, a partial region 21 of the contact layer 5 and selective oxidation layer 4 is eliminated (FIG. 4).

Figure 5:
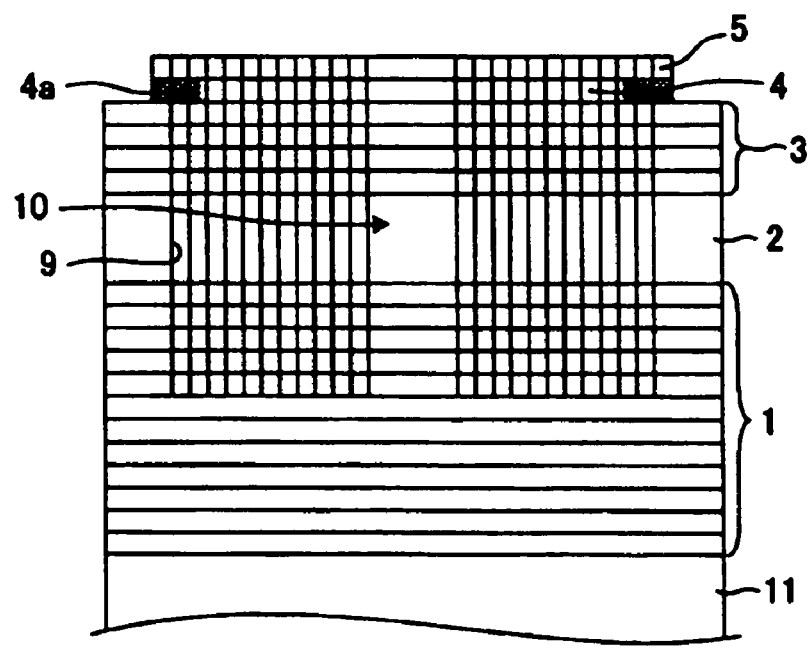
FIG. 5 is a second diagram illustrating the manufacturing process of the variable wavelength filter of FIG. 1.

Then, the oxidation is advanced in an oxidation furnace from the side face of the selective oxidation layer 4 containing Al to form the oxidized portion 4a for the current constriction. Then, a pattern of the photonic crystal structure shown in FIG. 3, i.e., a hole pattern as a lattice array of circles, is transferred by an electron beam lithography apparatus, to form an etching mask of the hole pattern on the contact layer 5. Then, using a chlorine-based dry etching apparatus, the holes 9 are formed which extend from the contact layer 5 to an upper region of the lower DBR layer 1. The depth of the hole 9 is approximately 2 μm. Since the diameter of the hole is 200 nm, an aspect ratio of the hole is approximately 10:1 (FIG. 5).

Figure 6:
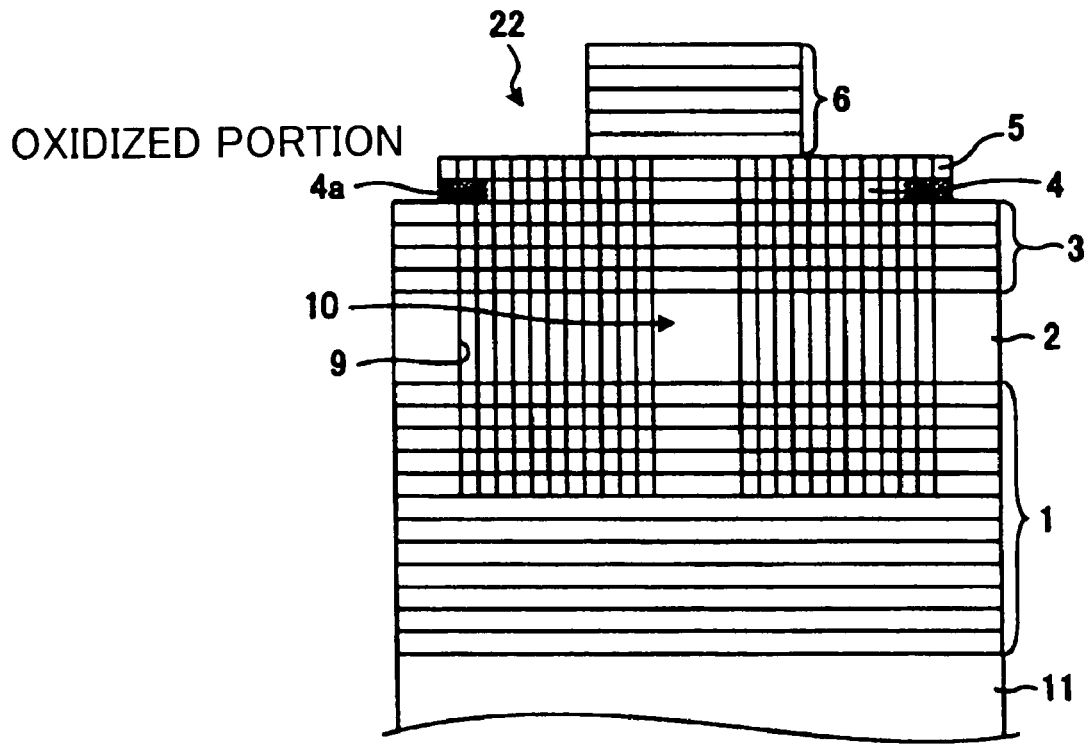
FIG. 6 is a third diagram illustrating the manufacturing process of the variable wavelength filter of FIG. 1.

Then, the dielectric multilayer film constituted by three pairs of $SiO_2$ and the amorphous silicon is laminated, and a region 22 is eliminated by etching so that the region 22 covers at least a stripe region corresponding to the line defect portion 10 to form the stripe-shaped dielectric multilayer film 6 (FIG. 6).

Figure 7:
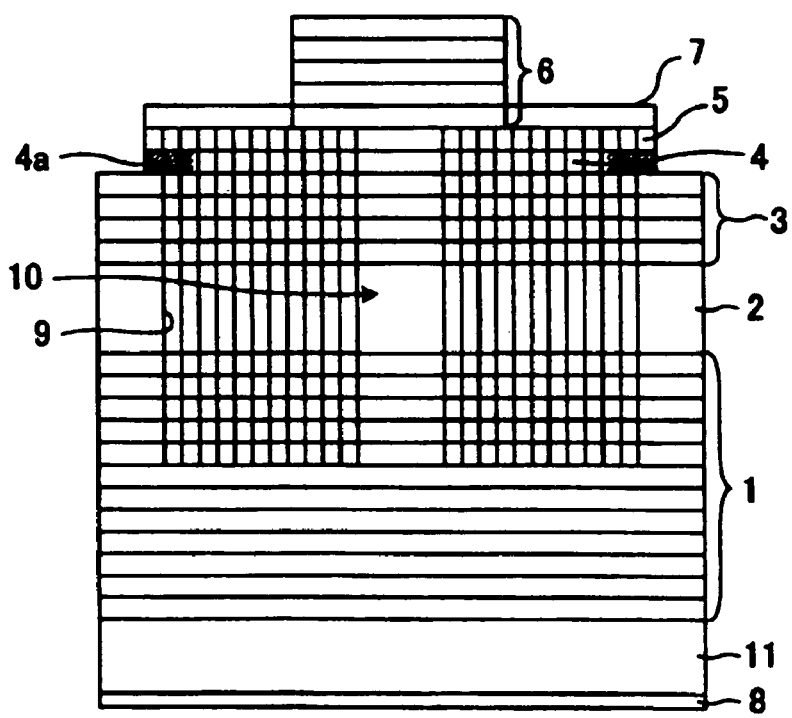
FIG. 7 is a fourth diagram illustrating the manufacturing process of the variable wavelength filter of FIG. 1.

Then, a lower side of the n-InP substrate 11 is polished so that the thickness of the device including the dielectric multilayer film 6 is approximately 120 μm. Thereafter, the p-electrode 7 and the n-electrode 8 are formed. In this way, the slab waveguide is formed (FIG. 7). Then, by connecting the variable power source 12 thereto, the variable wavelength filter is produced.

Figure 8:
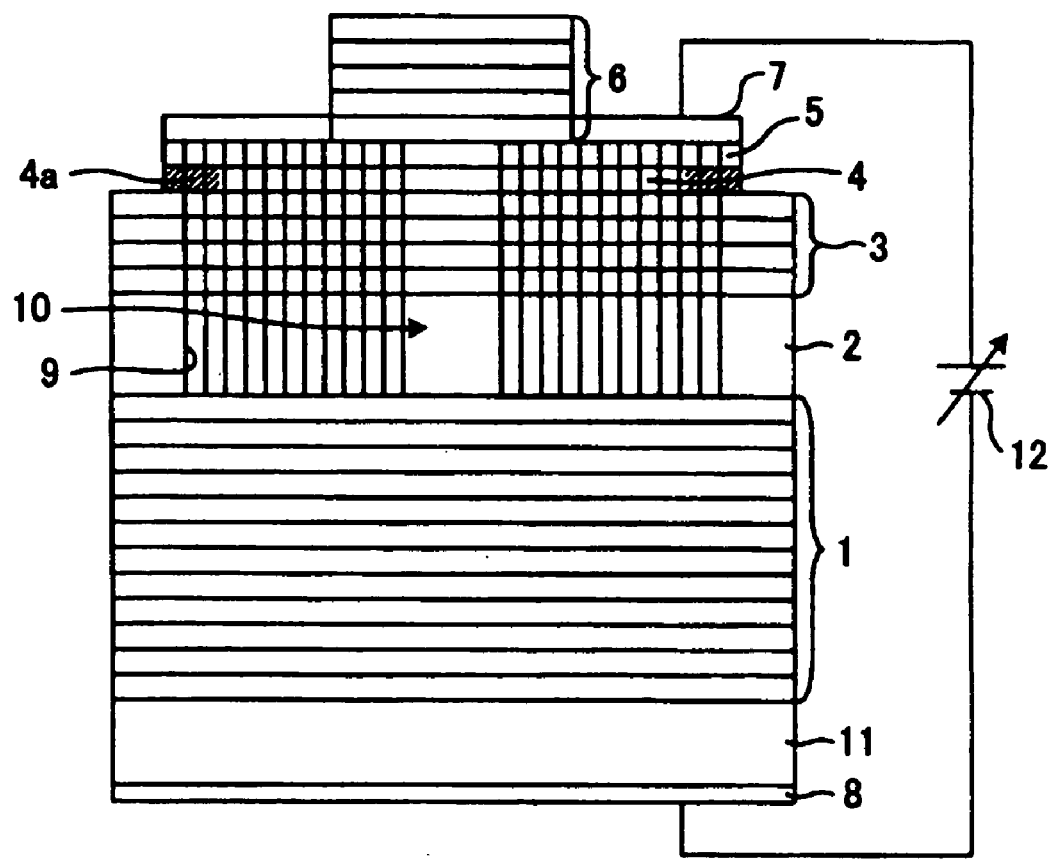
FIG. 8 is a cross-sectional view of a variation of the variable wavelength filter of FIG. 1.

It should be noted that, although the hole 9 extends to the lower DBR layer 1 in the variable wavelength filter shown in FIG. 1, it is not limited thereto and the lower end of the hole 9 may be terminated at the interface between the core layer 2 and the lower DBR layer 1 as shown in FIG. 8 or may not reach the lower DBR layer 1 by accurately controlling the etching in forming the hole 9. As a result, the aspect ratio of the hole 9 is decreased and the hole 9 with excellent accuracy can be formed. Moreover, it decreases the etching depth in forming the hole 9, and also eliminates those parameters concerning the hole 9 which require consideration to obtain a predetermined reflection property of the lower DBR layer 1, resulting in the lower DBR layer 1 being designed more readily.

Furthermore, although the DBR layer constituted by InGaAsP/AlInAs is formed on the InP substrate in the foregoing first embodiment, it is not limited thereto and a DBR layer constituted by a pair of GaAs/AlGaAs may be formed on a GaAs substrate, for example. Additionally, the core layer 2 may contain AlGaInAs. Moreover, the selective oxidation film 4 is not required to be disposed if a voltage may be applied to a portion other than a portion corresponding to the line defect portion 10. Additionally, although the dielectric multilayer film 6 is the dielectric multilayer film, other configurations are possible as long as it is able to achieve the high reflectivity for a predetermined wavelength.

Furthermore, in the foregoing first embodiment, if a multiple quantum well structure is employed as the core layer 2, the refractive index can be changed by a greater extent, allowing a variable range of wavelength being extended.

Additionally, in order to avoid being affected by the vacant hole 9 of the photonic crystal, the dielectric multilayer film 6 may be formed after applying a polymer or a dielectric material preliminarily onto the contact layer 5 by such as a spin coating to fill the hole 9, followed by performing such as a thermal treatment to solidify the polymer or dielectric material, and by performing the planarization processing. In this case, the refractive index difference between the core layer 2 in the photonic crystal structure and the lower DBR layer and the upper DBR layer 3 is decreased, possibly causing the characteristics of the photonic crystal structure to deviate. When this occurs, the parameters of the photonic crystal structure, such as the lattice constant, the diameter of the hole 9, or the width of the line defect portion 10, may be appropriately designed.

Now, a measurement result of the characteristics of the variable wavelength filter shown in FIG. 1 is described below. The measurement result of transmitted light intensity shows that the optical waveguide in which the line defect portion 10 is formed has an optical waveguide loss of approximately 7 dB/mm for the light having the wavelength of 1530 to 1560 nm. By injecting the current from the power source 12, a Fabry-Perot resonant wavelength of the optical waveguide can be shifted by approximately 5 nm at maximum.

Figure 9:
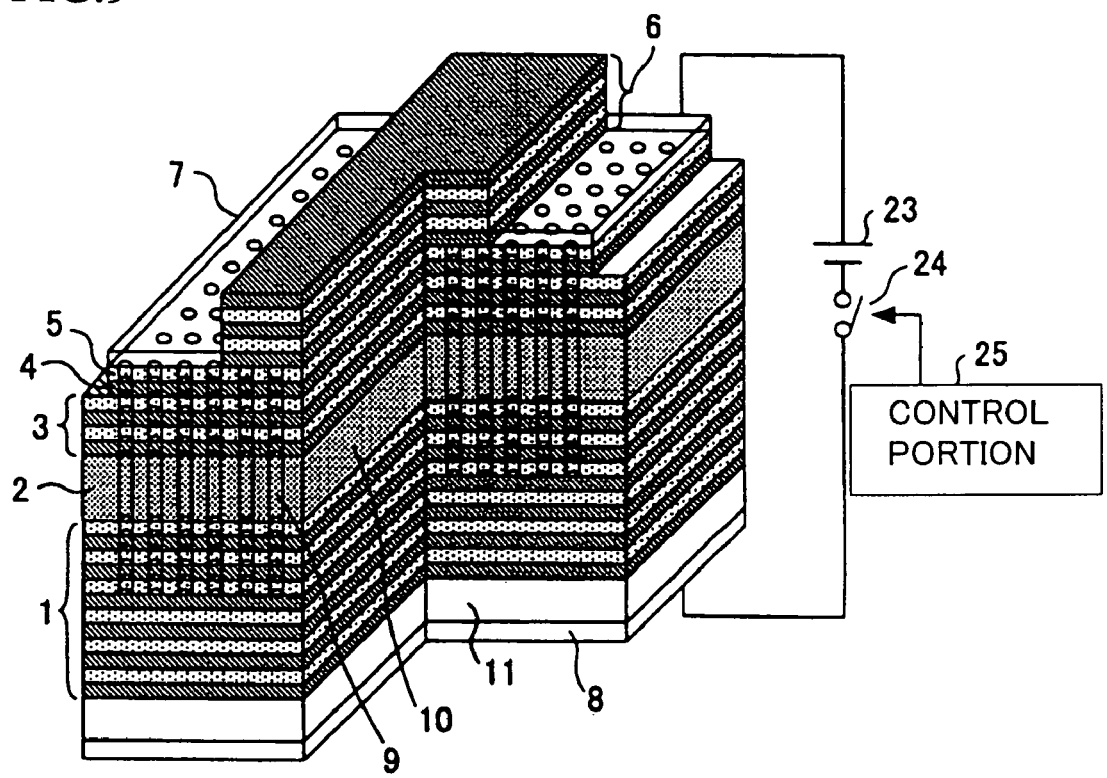
FIG. 9 is a diagram illustrating a configuration where a structure of FIG. 1 is applied to an optical switch or an optical modulator.

Although, in the foregoing embodiment, the optical waveguide or the variable wavelength filter is realized by forming the photonic crystal structure by means of the semiconductor process, it is not limited thereto and the semiconductor device such as an optical switch or an optical modulator may be formed using the photonic crystal structure having a similar line defect. FIG. 9 is a partially cutaway view in perspective of an example of the optical switch. As shown in FIG. 9, the optical switch is provided with a fixed power source 23 and a switch 24 arranged in series, instead of the variable power source 12 shown in FIG. 1, so that a control portion 25 turns on or off the switch 24. When the switch 24 is turned on, the current flows through the photonic crystal structure and the refractive index thereof is changed, shifting the wavelength band of the light passing through the optical waveguide of the line defect portion 10. For this reason, the light in the wavelength band, which was able to pass through the optical waveguide when the switch is turned off, is interrupted. As a result, the optical switch capable of performing on/off of the light in a desired wavelength band is realized. Incidentally, when realizing an optical modulator, the on/off signal of the control portion 25 is made to correspond to a modulation signal.

Figure 10:
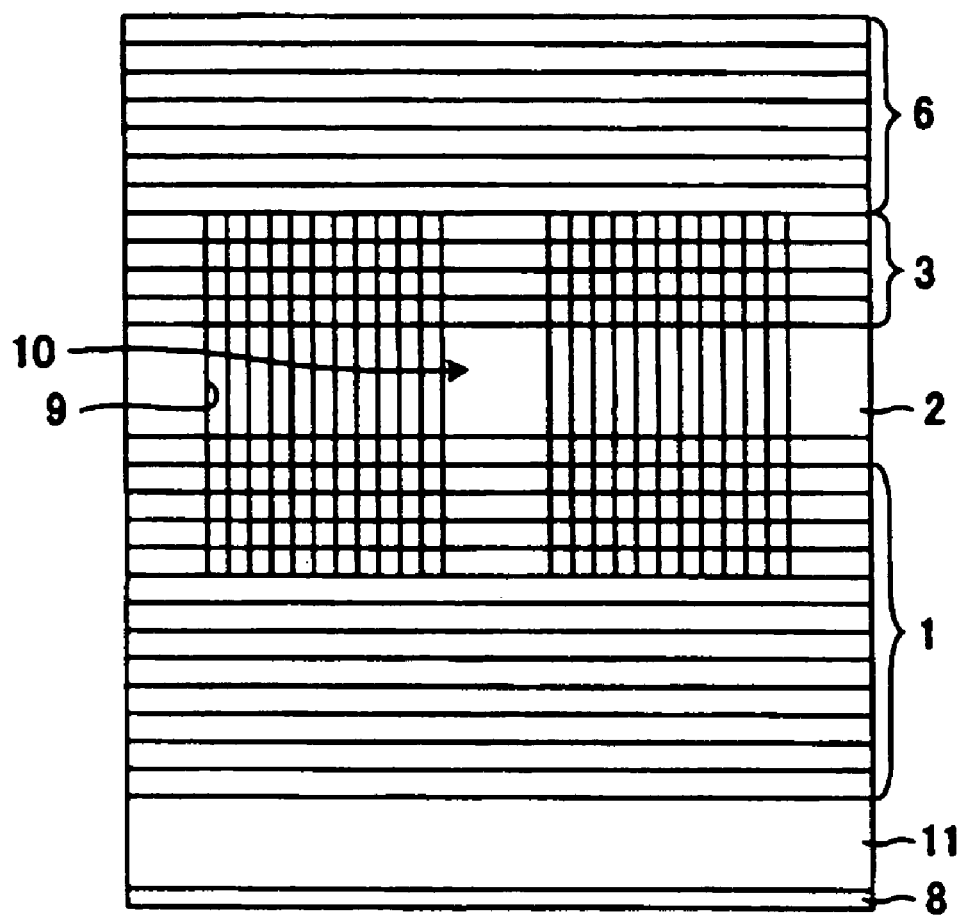
FIG. 10 is a diagram illustrating a configuration where the structure shown in FIG. 1 is applied to a slab optical waveguide.

FIG. 10 is a cross-sectional view of a slab optical waveguide, which is realized by forming only the photonic crystal structure of the variable wavelength filter corresponding to FIG. 1. Since it is not necessary to provide the electrode or to constrict the current in the slab optical waveguide, providing the selective oxidation film 4 and processing the etching for profile formation are not required, as shown in FIG. 10. For this reason, the slab optical waveguide using the photonic crystal structure can be formed with a simple configuration. Incidentally, the hole 9 may be formed to pass through all layers of the lower DBR layer 1. Additionally, the hole 9 may be formed so that it is not deeper than the interface between the core layer 2 and the lower DBR layer 1.

In the embodiment, since the hole 9 of the photonic crystal structure having the line defect portion 10 is formed at the minimum aspect ratio as required using the semiconductor process, the photonic crystal structure with excellent accuracy can be formed. Moreover, using a semiconductor reflective film such as the lower DBR layer 1, an radiation leaky mode from the two-dimensional photonic crystal structure can be readily inhibited.

Figure 11:
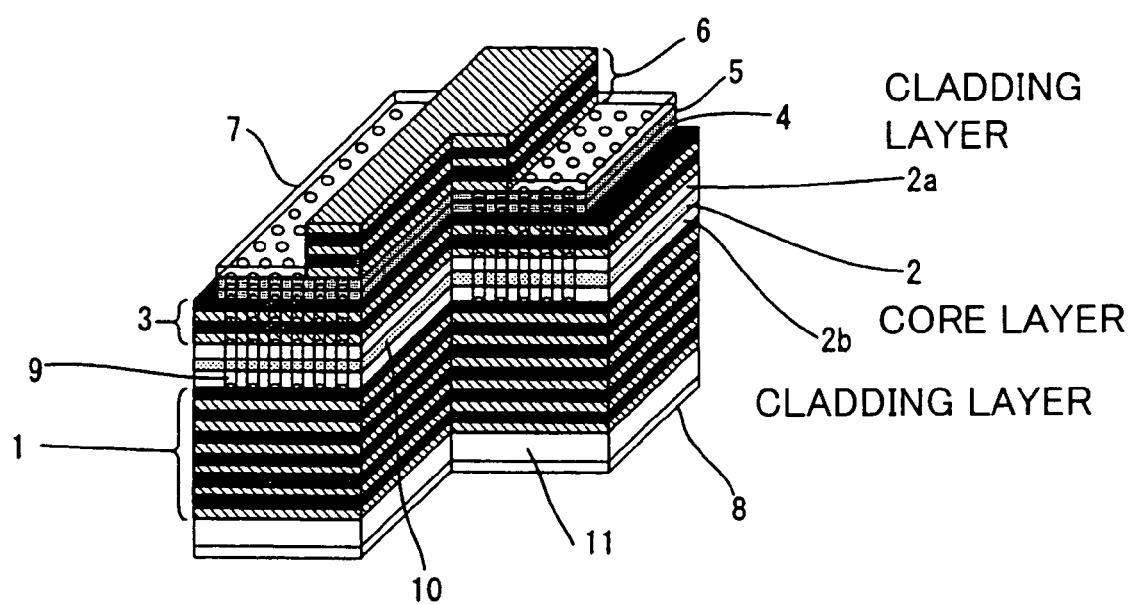
FIG. 11 is a partially cutaway view in perspective of another structure of the variable wavelength filter as the photonic crystal semiconductor device, according to the first embodiment of the present invention.

In the layer between the lower DBR layer 1 and the upper DBR layer 3, it is preferred to have a structure where the core layer 2 is disposed between an upper cladding layer 2a and a lower cladding layer 2b as shown in FIG. 11. In this case, the upper cladding layer 2a and the lower cladding layer 2b are constituted by such as InGaAsP and the compositions thereof are adjusted so that the energy band gap is greater than the energy band gap of the core layer 2.

In this case, the hole 9 constituting the photonic crystal passes through the upper cladding layer 2a and the core layer 2, and reaches the lower cladding layer 2b, but does not reach the lower DBR layer 1. Alternatively, the hole 9 may have the depth which reaches the lower DBR layer 1 like that in FIG. 1.

Also in this case, an upper portion of the line defect has an optical confinement structure in which the light is reflected vertically and returned to the line defect portion 10 with the upper DBR layer 3 and the dielectric multilayer film 6, and both sides of the line defect portion 10 has an optical confinement structure in which the light in the transverse direction is confined because of the photonic crystal structure having the hole 9. Since the optical confinement in the vertical direction may be weak in a region on both sides of the line defect portion 10, the dielectric multilayer film 6 is not formed in that region. In addition, since the holes 9 are formed only in the upper DBR layer 3, i.e. since the holes 9 are not formed in all of the upper reflective film constituted by the dielectric multilayer film 6 and the upper DBR layer 3 on both sides of the line defect section 10, the aspect ratio of the holes 9 can be small. Furthermore, since the p-electrode 7 is disposed on the upper DBR layer 3 situated in the middle of the upper reflective film, the distance between the p-electrode 7 and the n-electrode 8 is decreased, which reduces a resistance therebetween and the power consumption. It should be noted that the light guided through the line defect portion 10 is that in the wavelength band corresponding to the photonic band gap of the photonics crystal.

The lower DBR layer 1 and the lower cladding layer 2b serve as an n-type layer by an n-type dopant such as silicon (Si) being doped, while the upper DBR layer 3, the upper cladding layer 2a, the selective oxidation layer 4, and the contact layer 5 serve as a p-type layer by a p-type dopant such as zinc (Zn) being doped.

Second Embodiment

Next, a second embodiment of the present invention will be described. While the foregoing embodiment is the photonic crystal semiconductor device which has the photonic crystal structure having the line defect portion 10, in the second embodiment is realized the photonic crystal semiconductor device which has the photonic crystal structure having a point defect portion.

Figure 12:
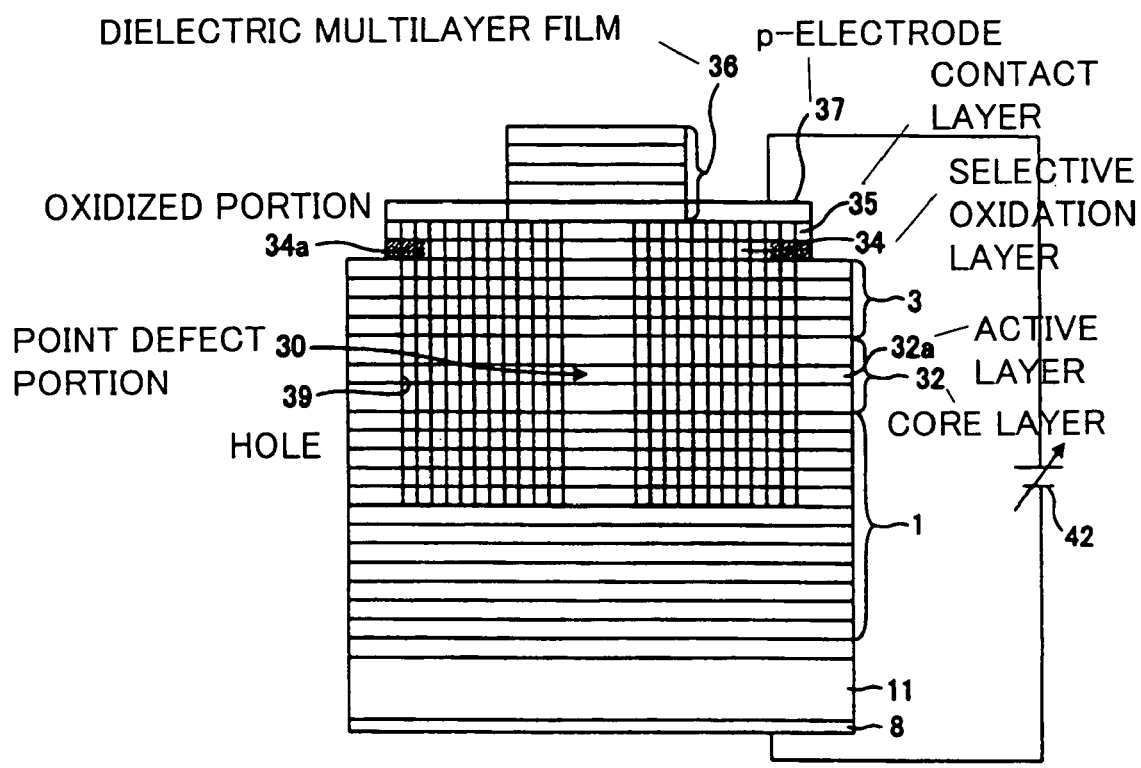
FIG. 12 is a partially cutaway view in perspective of a semiconductor laser as a photonic crystal semiconductor device, according to a second embodiment of the present invention.
Figure 13:
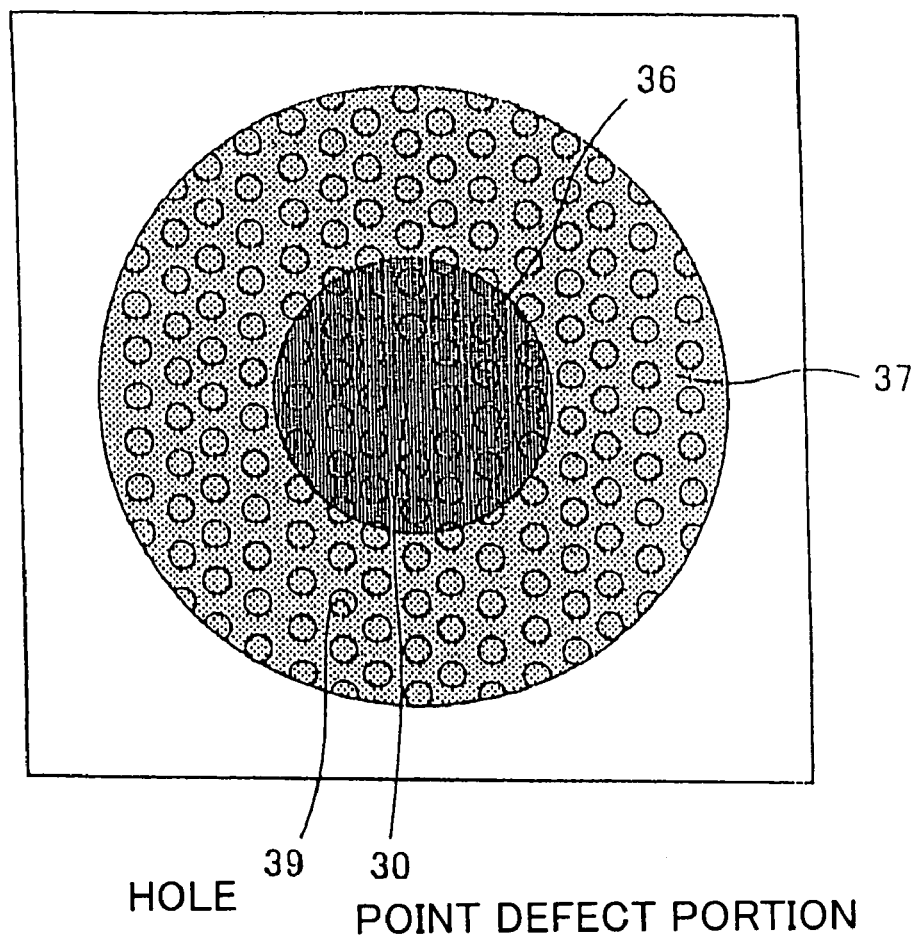
FIG. 13 is a plan view of the semiconductor laser of FIG. 12.

FIG. 12 is a cross-sectional view of the semiconductor laser of the second embodiment, and FIG. 13 is a plan view of the semiconductor laser shown in FIG. 12. In FIG. 12, the semiconductor laser is an in-plane resonance type semiconductor laser, wherein a core layer 32 having an active layer 32a constituted by GaInNAsSb is disposed instead of the core layer 2 shown in FIG. 1. Although other sectional configurations are similar to those shown in FIG. 1, the semiconductor laser of FIG. 12 is different from that in FIG. 1 in that the photonic crystal structure with a point defect portion 30 is formed, instead of the line defect portion 10. That is, as shown in FIG. 13, the point defect portion 30 is formed as a defect of the photonic crystal so that the surrounding structure confines the light two-dimensionally. In this configuration, the holes 39 of the photonic crystal are surrounding the point defect portion 30. Additionally, an electrode 37 is shaped in an annular form instead of the stripe form. In this embodiment, the GaAs substrate is used instead of the n-InP substrate of the foregoing embodiment, and the DBR layers such as the lower DBR layer 1 are constituted by pairs of GaAs/AlGaAs.

When the current is injected from a variable power source 42 through the electrode 37, the light in 1310 nm-band excited in the active layer 32a of the point defect portion 30 is resonated between the lower DBR layer 1 and the upper DBR layer 3 plus the dielectric multilayer film 6, so that a laser beam is emitted through the dielectric multilayer film 6.

It should be noted that the point defect portion 30 may not correspond to a defect of a single hole 39 but may correspond to a plurality of point defects. Moreover, a multiple quantum well structure may be used as the active layer 32a.

When comparing the semiconductor laser shown in the second embodiment with an air-bridge type semiconductor laser which has a substantially similar structure, the Q value of the point defect portion 30 according to the second embodiment is approximately 3000 while that of the air-bridge type is approximately 4000. Consequently, it is understood that, in the semiconductor laser shown in the second embodiment, a resonator is formed which is substantially similar to that of the air-bridge type semiconductor laser.

Incidentally, the depth of the hole 39 in FIG. 12 may not reach the lower DBR layer 1, like the hole 9 shown in FIG. 8.

Third Embodiment

Figure 14:
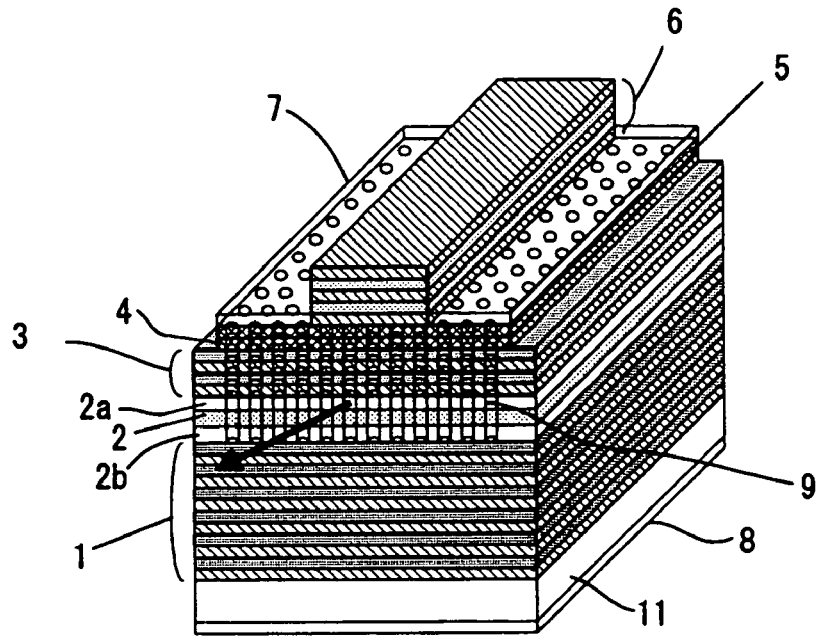
FIG. 14 is a partially cutaway view in perspective of a superprism as a photonic crystal semiconductor device, according to a third embodiment of the present invention.
Figure 15:
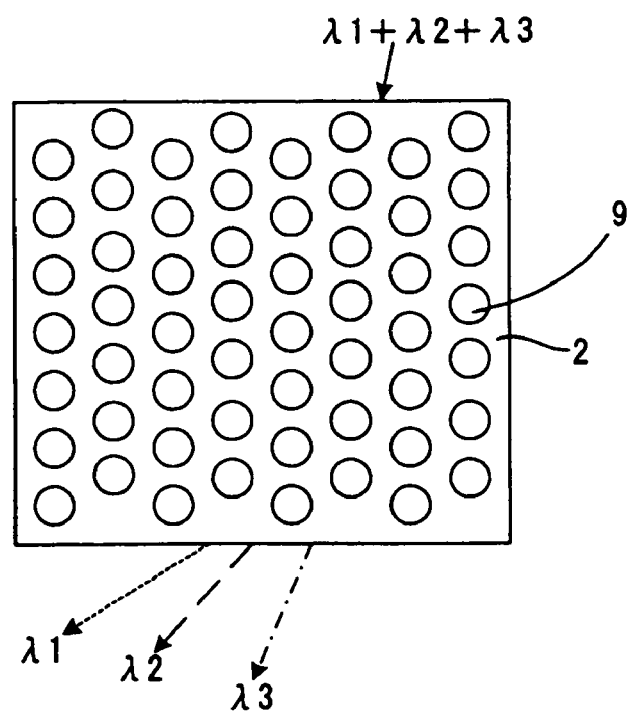
FIG. 15 is a plan view illustrating a core layer of the photonic crystal semiconductor device in FIG. 14.

FIG. 14 is a perspective view illustrating a photonic crystal semiconductor device of a third embodiment of the present invention, which is used as a superprism, and FIG. 15 is a plan view illustrating a core layer of the photonic crystal semiconductor device shown in FIG. 14. In these figures, like reference numerals as FIGS. 1 and 11 indicate the similar elements.

In FIGS. 14 and 15, the lower DBR layer 1, the lower cladding layer 2b, the core layer 2, the upper cladding layer 2a, the upper DBR layer 3, the selective oxidation layer 4, and the contact layer 5 are formed in that order on the n-InP substrate 11 by the MOCVD method. Further, the stripe-shaped dielectric multilayer film 6 is formed on the contact layer 5 to extend along the direction of the light-guiding. Additionally, on both sides of the dielectric multilayer film 6, the p-electrode 7 is formed on the contact layer 5.

A plurality of holes 9 are formed in a triangular configuration in the upper DBR layer 3, the upper cladding layer 2a, the core layer 2, and the lower cladding layer 2b, to constitute the photonic crystal structure. A point defect portion or a line defect portion is not formed in the photonic crystal structure, unlike with the first and second embodiments.

In the photonic crystal of the embodiment stated above, the traveling direction of the light can be considerably shifted by slightly changing the wavelength or the incidence angle of the light which enters into the core layer 2. That is, in the photonic crystal, a photonic band structure is formed due to its periodic structure, in which the propagation direction of the light changes sensitively in accordance with the wavelength or the incidence angle thereof.

Accordingly, when the lower portion of the dielectric multilayer film 6 is used as the optical waveguide and the light including a plurality of wavelengths $\lambda 1$, $\lambda 2$, and $\lambda 3$ is entered into one end of the core layer 2 of the optical waveguide, the light is split in accordance with the different wavelengths and emitted from the other end of the core layer 2 at different positions. In contrast, when a plurality of light are incident on the other end of the core layer 2 with different incidence positions or angles depending on their wavelengths, these lights having the different wavelengths are combined and emitted from one position of the one end thereof.

As described above, the photonic crystal semiconductor device in FIG. 14 can be used as an optical coupler/splitter.

By changing the current flowing between the p-electrode 7 and the n-electrode 8, the wavelength band of the light guided in the core layer 2 can be changed. Incidentally, by adjusting the width of the dielectric multilayer film 6, the current flowing from the p-electrode 7 can be guided to the core layer 2 portion under the dielectric film 6.

Fourth Embodiment

Figure 16:
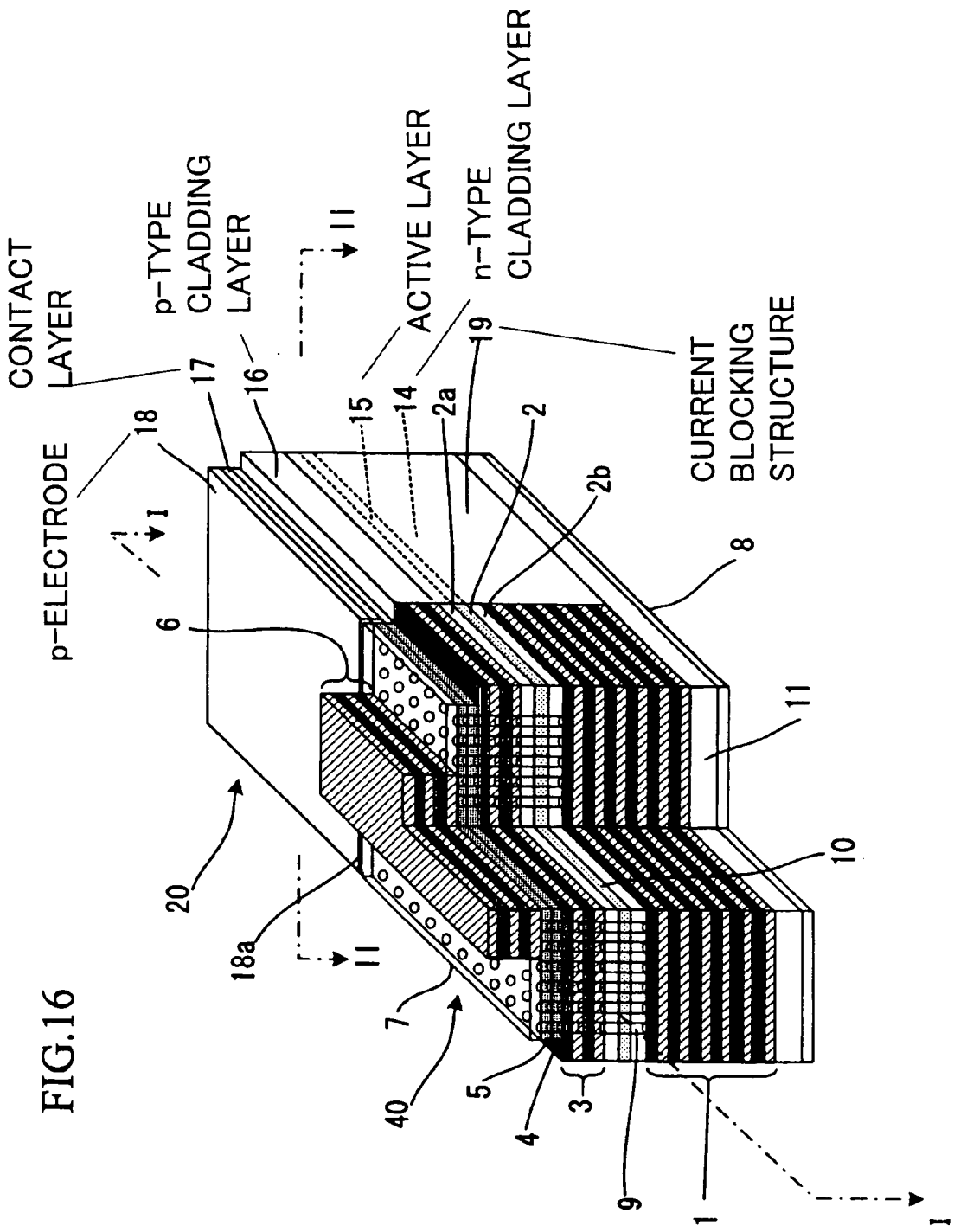
FIG. 16 is a partially cutaway view in perspective of a photonic crystal optical device integrated with a semiconductor laser, according to a fourth embodiment of the present invention.
Figure 17:
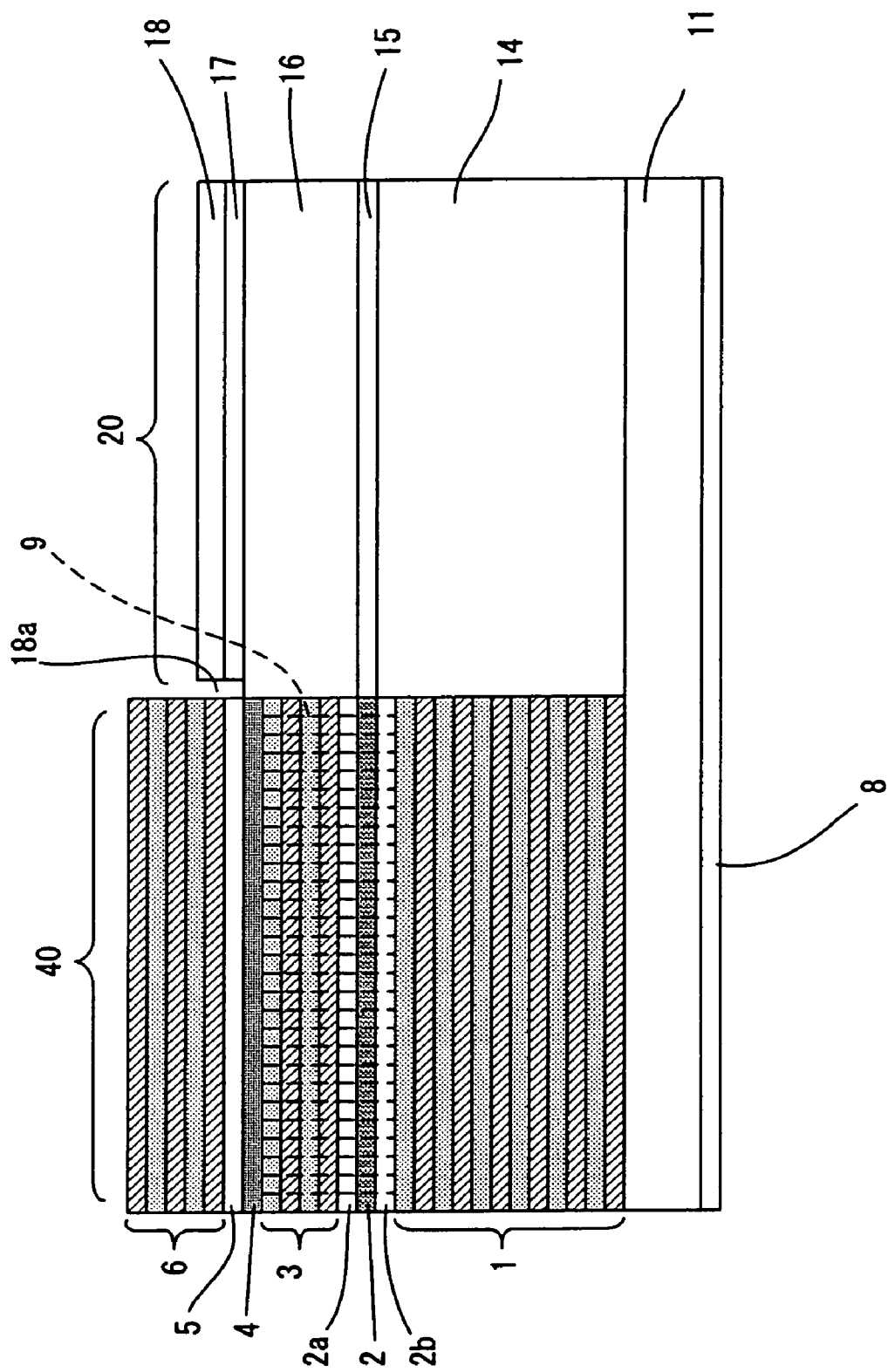
FIG. 17 is a cross-sectional view taken along a line I-I of FIG. 16.
Figure 18:
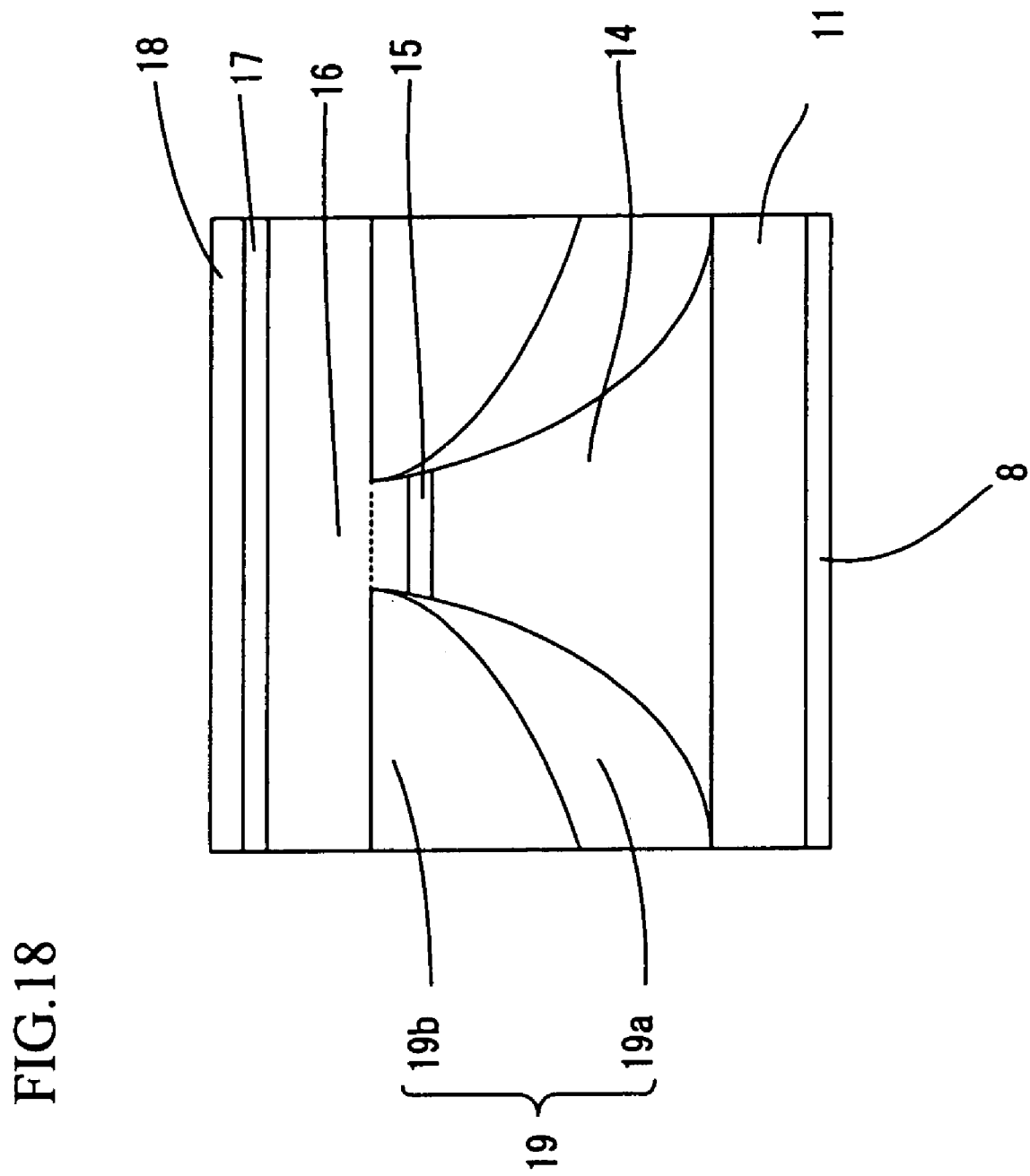
FIG. 18 is a cross-sectional view taken along a line II-II of FIG. 16.

FIG. 16 is a perspective cross-sectional view illustrating a photonic crystal optical device integrated with a semiconductor laser, according to a fourth embodiment of the present invention. FIG. 17 is a cross-sectional view taken along a line I-I of FIG. 16, and FIG. 18 is a cross-sectional view taken along a line II-II of FIG. 16. In FIGS. 16 and 17, like reference numerals as FIG. 1 indicate the similar elements.

In FIG. 16, on a region of n-InP substrate 11 where the photonic crystal semiconductor device is formed, the variable wavelength filter 40 is formed in accordance with the steps described in the first embodiment. The variable wavelength filter 40 has the lower DBR layer 1, the lower cladding layer 2b, the core layer 2, the upper cladding layer 2a, the upper DBR layer 3, the selective oxidation layer 4, the contact layer 5, the dielectric multilayer film 6, and the p-electrode 7.

Moreover, on another region of n-InP substrate 11 adjacent the variable wavelength filter 40, where the semiconductor laser 20 is formed. The semiconductor laser 20 has an n-type cladding layer 14 constituted by n-InP, an active layer 15 having an SCH structure, a p-type cladding layer 16 constituted by p-MnP, and a contact layer 17 constituted by $p^+$-InGaAs formed in that order on the n-InP substrate 11 using the MOCVD method. Further, the semiconductor laser 20 has a p-electrode 18 formed on a contact layer 17 for driving the laser. Incidentally, the p-electrode 18 is constituted by Ti/Pt/Au.

The active layer 15 has the SCH (Separate Confinement Heterostructure) structure, constituted by a multiple quantum well layer and optical confinement layers between which the multiple quantum well layer is disposed. The multiple quantum well layer is constituted by a plurality of quantum well layers and barrier layers between which each of the quantum well layers is disposed. The quantum well layer and the barrier layer are constituted by InGaAsP having different composition ratios, respectively. Additionally, the optical confinement layer is constituted by InGaAsP whose composition is adjusted so that the energy band gap thereof is greater than that of the barrier layer.

The semiconductor layers from the n-type cladding layer 14 to the p-type cladding layer 16, which constitute the semiconductor laser 20, are selectively grown while a photonic crystal semiconductor device region is masked with the dielectric film. Moreover, the semiconductor layers from the lower DBR layer 1 to the selective oxidation layer 4, which constitute the photonic crystal semiconductor device 40, are selectively grown while the semiconductor laser region is masked with the dielectric film. Silicon dioxide or silicon nitride, for example, is used as the material for the dielectric film.

The contact layer 17 of the semiconductor laser 20 and the contact layer 5 of the variable wavelength filter are formed simultaneously, and are separated by a slot 18a formed by means of photolithography technique.

Additionally, the n-type cladding layer 14, the active layer 15, and a lower portion of the p-type cladding layer 14, which constitutes the semiconductor laser 20, are patterned in a stripe shape extending in the direction of light-guiding, to have a ridge structure as shown in FIG. 18. On both sides of the ridge structure, a p-InP buried layer 19a and an n-InP buried layer 19b are laminated in that order to form a current blocking structure.

One end of the stripe-shaped active layer 15 is connected to an end of the core layer 2 in the line defect portion 10 of the variable wavelength filter 40.

In the photonic crystal optical element integrated with the semiconductor laser having the structure described above, when the current is flown from the p-electrode 18 to the n-electrode 8 of the semiconductor laser 20, the laser beam having a broad wavelength spectrum is emitted from the active layer 15 of the semiconductor laser 20 toward the core layer 2 of the variable wavelength filter 40. The variable wavelength filter 40, upon incidence of the laser beam, selects wavelength of the light and guide the selected wavelength of light through the line defect portion 10. The wavelength is selected by adjusting the value of the current flown through the photonic crystal between the n-electrode 8 and the p-electrode 7 of the variable wavelength filter 12.

According to the photonic crystal optical element integrated with the semiconductor laser described above, the semiconductor laser 20 and the variable wavelength filter 40 are formed on the single n-InP substrate 11, allowing the optical integrated element being microminiaturized.

It should be noted that, the photonic crystal semiconductor device to be integrated with the semiconductor laser 20 on the InP board 11 may be, besides the variable wavelength filter 40, any of the slab waveguide, the optical switch, the optical modulator, and the superprism
described in the foregoing embodiments, for example.

What is claimed is:

1. A photonic crystal semiconductor device comprising:
   a semiconductor substrate;
   a lower semiconductor distributed Bragg reflector multilayer film laminated on said semiconductor substrate;
   a semiconductor core layer laminated on said lower semiconductor distributed Bragg reflector multilayer film;
   an upper semiconductor distributed Bragg reflector multilayer film laminated on said semiconductor core layer;
   a dielectric multilayer film laminated on said upper semiconductor distributed Bragg reflector multilayer film; and
   a plurality of holes passing through said upper semiconductor distributed Bragg reflector multilayer film and said semiconductor core layer to form a photonic crystal structure with a two-dimensional periodic structure of refractive index in the semiconductor core layer, the period of the two-dimensional periodic structure being near a wavelength of light to be propagated in said semiconductor core layer,
   wherein said lower semiconductor distributed Bragg reflector multilayer film, said upper semiconductor distributed Bragg reflection multilayer film, and said dielectric multilayer film are configured to prevent light in a wavelength of specific band from leaking in a lamination direction.

2. The photonic crystal semiconductor device according to claim 1, wherein said two-dimensional periodic structure of refractive index has a line defect portion with none of said plurality of holes formed therein, the line defect portion being disposed between said holes.

3. The photonic crystal semiconductor device according to claim 1, wherein said two-dimensional periodic structure of refractive index has a point defect portion with none of said plurality of holes formed therein, the point defect portion being disposed among said holes.

4. The photonic crystal semiconductor device according to claim 1, further comprising:
   a lower cladding layer laminated between said lower semiconductor distributed Bragg reflector multilayer film and said semiconductor core layer; and
   an upper cladding layer laminated between said semiconductor core layer and said upper semiconductor distributed Bragg reflector multilayer film,
   wherein said plurality of holes pass through said upper cladding layer and said lower cladding layer.

5. The photonic crystal semiconductor device according to claim 1, wherein said plurality of holes pass through at least a part of said lower semiconductor distributed Bragg reflector multilayer film.

6. The photonic crystal semiconductor device according to claim 1, further comprising an electrode configured to apply a current or a voltage to the photonic crystal structure.

7. The photonic crystal semiconductor device according to claim 2, further comprising an electrode configured to apply a current or a voltage to the photonic crystal structure.

8. The photonic crystal semiconductor device according to claim 3, further comprising an electrode configured to apply a current or a voltage to the photonic crystal structure.

9. The photonic crystal semiconductor device according to claim 2, further comprising a selective oxidation layer containing Al for current constriction, said selective oxidation layer disposed in a vicinity of said semiconductor core layer.

10. The photonic crystal semiconductor device according to claim 3, further comprising a selective oxidation layer containing Al for current constriction, said selective oxidation layer disposed in a vicinity of said semiconductor core layer.

11. The photonic crystal semiconductor device according to claim 2, wherein said semiconductor core layer has an active layer.

12. The photonic crystal semiconductor device according to claim 3, wherein said semiconductor core layer has an active layer.

13. The photonic crystal semiconductor device according to claim 1, wherein said semiconductor core layer has a multiple quantum well structure.

14. The photonic crystal semiconductor device according to claim 11, wherein said semiconductor core layer has a multiple quantum well structure.

15. The photonic crystal semiconductor device according to claim 12, wherein said semiconductor core layer has a multiple quantum well structure.

16. The photonic crystal semiconductor device according to claim 1, wherein said semiconductor core layer contains InGaAsP.

17. The photonic crystal semiconductor device according to claim 1, wherein said semiconductor core layer contains GaInNAsSb.

18. The photonic crystal semiconductor device according to claim 1, wherein said semiconductor core layer contains AlGaInAs.

19. A variable wavelength filter comprising:
   a photonic crystal semiconductor device including
      a semiconductor substrate,
      a lower semiconductor distributed Bragg reflector multilayer film laminated on said semiconductor substrate,
      a semiconductor core layer laminated on said lower semiconductor distributed Bragg reflector multilayer film,
      an upper semiconductor distributed Bragg reflector multilayer film laminated on said semiconductor core layer,
      a dielectric multilayer film laminated on said upper semiconductor distributed Bragg reflector multilayer film, and
      a plurality of holes passing through said upper semiconductor distributed Bragg reflector multilayer film and said semiconductor core layer to form a photonic crystal structure with a two-dimensional periodic structure of refractive index in the semiconductor core layer, the period of the two-dimensional periodic structure being near a wavelength of light to be propagated in said semiconductor core layer, wherein said two-dimensional periodic structure of refractive index has a line defect portion with none of said plurality of holes formed therein, the line defect portion being disposed between said holes, said lower semiconductor distributed Bragg reflector multilayer film, said upper semiconductor distributed Bragg reflector multilayer film, and said dielectric multilayer film are configured to prevent light in a wavelength of specific band from leaking in a lamination direction;

an electrode configured to apply a current or a voltage to the photonic crystal structure portion; and a variable power source connected to said electrode, such that light propagating through said defect portion is filtered.

20. The photonic crystal semiconductor device according to claim 1, further comprising a semiconductor laser element formed on said semiconductor substrate, said semiconductor laser element having an active layer optically connected with said semiconductor core layer.

21. The photonic crystal semiconductor device according to claim 20, wherein said two-dimensional periodic structure of refractive index has a line defect portion with none of said plurality of holes formed therein, said line defect portion being disposed between said holes, and said active layer of said semiconductor laser element is optically connected with said line defect portion of said semiconductor core layer.

* * * * *